(12) United States Patent
Zhao et al.

(10) Patent No.: US 12,387,910 B2
(45) Date of Patent: *Aug. 12, 2025

(54) PLASMA PROCESSING WITH BROADBAND RF WAVEFORMS

(71) Applicant: Tokyo Electron Limited, Tokyo (JP)

(72) Inventors: Jianping Zhao, Austin, TX (US); John Carroll, Austin, TX (US); Charles Schlechte, Austin, TX (US); Peter Lowell George Ventzek, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/671,680

(22) Filed: May 22, 2024

(65) Prior Publication Data

US 2024/0312766 A1    Sep. 19, 2024

Related U.S. Application Data

(63) Continuation of application No. 17/865,225, filed on Jul. 14, 2022, now Pat. No. 12,020,902.

(51) Int. Cl.
*H01J 37/32* (2006.01)

(52) U.S. Cl.
CPC .. *H01J 37/32183* (2013.01); *H01J 37/32128* (2013.01); *H01J 37/32146* (2013.01);
(Continued)

(58) Field of Classification Search
CPC ............... H01J 37/32; H01J 37/32009; H01J 37/32082; H01J 37/32183;
(Continued)

(56) References Cited

U.S. PATENT DOCUMENTS

| 4,887,005 A | 12/1989 | Rough et al. |
| 5,210,466 A | 5/1993 | Collins et al. |
| (Continued) | | |

FOREIGN PATENT DOCUMENTS

| KR | 20030051692 A | 6/2003 |
| WO | 2012078569 A1 | 6/2012 |

OTHER PUBLICATIONS

PCT International Search Report and Written Opinion, International Application No. PCT/US2020/054402, dated Jul. 5, 2021, 12 pages.
(Continued)

*Primary Examiner* — Thai Pham
(74) *Attorney, Agent, or Firm* — Slater Matsil, LLP

(57) ABSTRACT

A plasma system includes a plasma apparatus comprising a plasma chamber and a substrate support disposed in the plasma chamber. The system includes an electromagnetic (EM) circuit block coupled to a radio frequency (RF) electrode. The EM circuit block includes a broadband RF waveform function generator, the broadband RF waveform having EM power distributed over a range of frequencies, and a broadband impedance matching network having an input coupled to an output of the broadband RF waveform function generator and an output coupled to a terminal of the RF electrode, an operating frequency range of the broadband impedance matching network including the range of frequencies. The system includes a controller programmed to adjust an input parameter of the EM circuit block.

22 Claims, 7 Drawing Sheets

(52) U.S. Cl.
CPC .... *H01J 37/32541* (2013.01); *H01J 37/3299* (2013.01); *H01J 2237/24564* (2013.01)

(58) Field of Classification Search
CPC .......... H01J 37/32128; H01J 37/32146; H01J 37/32155; H01J 37/32541; H01J 37/3299; H01J 37/32532; H01J 2237/24564
See application file for complete search history.

(56) References Cited

U.S. PATENT DOCUMENTS

| | | | |
|---|---|---|---|
| 5,392,018 | A | 2/1995 | Collins et al. |
| 5,556,501 | A | 9/1996 | Collins et al. |
| 5,572,170 | A | 11/1996 | Collins et al. |
| 5,656,123 | A | 8/1997 | Salimian et al. |
| 5,707,486 | A | 1/1998 | Collins |
| 5,865,937 | A | 2/1999 | Shan et al. |
| 6,043,607 | A * | 3/2000 | Roderick ................ H05H 1/46 315/111.21 |
| 6,068,784 | A | 5/2000 | Collins et al. |
| 6,251,792 | B1 | 6/2001 | Collins et al. |
| 6,541,380 | B2 | 4/2003 | Ying et al. |
| 6,545,420 | B1 | 4/2003 | Collins et al. |
| 6,703,080 | B2 | 3/2004 | Reyzelman et al. |
| 6,920,312 | B1 | 7/2005 | Benjamin |
| 7,004,107 | B1 | 2/2006 | Raoux et al. |
| 7,212,078 | B2 | 5/2007 | Windhorn |
| 7,276,135 | B2 | 10/2007 | Dhindsa et al. |
| 7,625,460 | B2 | 12/2009 | Howard |
| 8,083,961 | B2 | 12/2011 | Chen et al. |
| 8,674,606 | B2 | 3/2014 | Carter et al. |
| 8,686,918 | B1 | 4/2014 | Diaz |
| 8,773,312 | B1 | 7/2014 | Diaz |
| 8,847,846 | B1 | 9/2014 | Diaz |
| 9,196,459 | B2 | 11/2015 | Bhutta |
| 9,576,811 | B2 | 2/2017 | Kanarik et al. |
| 9,578,731 | B2 | 2/2017 | Van Zyl |
| 9,652,567 | B2 | 5/2017 | Valcore, Jr. et al. |
| 9,748,076 | B1 | 8/2017 | Choi et al. |
| 9,872,373 | B1 | 1/2018 | Shimizu et al. |
| 10,269,540 | B1 | 4/2019 | Carter et al. |
| 10,304,663 | B1 | 5/2019 | Kapoor et al. |
| 11,017,983 | B2 | 5/2021 | Mavretic |
| 11,170,981 | B2 | 11/2021 | Zhao et al. |
| 11,295,937 | B2 | 4/2022 | Zhao et al. |
| 11,348,761 | B2 | 5/2022 | Carroll et al. |
| 11,830,709 | B2 | 11/2023 | Zhao et al. |
| 2002/0004309 | A1 | 1/2002 | Collins et al. |
| 2002/0185227 | A1 | 12/2002 | MacGearailt |
| 2003/0207583 | A1 | 11/2003 | Kuthi et al. |
| 2004/0007985 | A1 | 1/2004 | De Vries et al. |
| 2004/0060660 | A1 | 4/2004 | Klimecky et al. |
| 2004/0114399 | A1 | 6/2004 | Lincoln et al. |
| 2004/0242021 | A1 | 12/2004 | Kraus et al. |
| 2005/0112891 | A1 | 5/2005 | Johnson et al. |
| 2005/0264219 | A1 | 12/2005 | Dhindsa et al. |
| 2005/0275980 | A1 | 12/2005 | Coleman |
| 2006/0037701 | A1 | 2/2006 | Koshiishi et al. |
| 2006/0262889 | A1 | 11/2006 | Kalvaitis et al. |
| 2007/0029500 | A1 | 2/2007 | Coulombe et al. |
| 2007/0107844 | A1 | 5/2007 | Bullock et al. |
| 2010/0159705 | A1 | 6/2010 | Qiu et al. |
| 2011/0006687 | A1 | 1/2011 | Gesche |
| 2012/0064726 | A1 | 3/2012 | Nozawa et al. |
| 2012/0074844 | A1 | 3/2012 | York et al. |
| 2012/0188007 | A1 | 7/2012 | Van Zyl et al. |
| 2014/0139218 | A1 | 5/2014 | Findeklee et al. |
| 2014/0195033 | A1 | 7/2014 | Lyndaker et al. |
| 2014/0214395 | A1 | 7/2014 | Valcore, Jr. et al. |
| 2015/0011073 | A1 | 1/2015 | Lei et al. |
| 2015/0179406 | A1 | 6/2015 | Johnson et al. |
| 2015/0319838 | A1 | 11/2015 | Bhutta |
| 2016/0241234 | A1 | 8/2016 | Mavretic |
| 2016/0295677 | A1 * | 10/2016 | Leeser ................ H05H 1/46 |
| 2017/0104469 | A1 | 4/2017 | Mavretic |
| 2018/0019515 | A1 | 1/2018 | Zhang et al. |
| 2018/0026589 | A1 | 1/2018 | Labanc et al. |
| 2018/0041183 | A1 | 2/2018 | Mavretic et al. |
| 2018/0068852 | A1 | 3/2018 | Cottle et al. |
| 2019/0006995 | A1 | 1/2019 | Jurkov et al. |
| 2019/0115191 | A1 | 4/2019 | Mavretic et al. |
| 2019/0172683 | A1 | 6/2019 | Mavretic et al. |
| 2019/0267212 | A1 | 8/2019 | Mavretic |
| 2019/0272978 | A1 | 9/2019 | Ahmed et al. |
| 2019/0318919 | A1 | 10/2019 | Lyndaker et al. |
| 2020/0144032 | A1 | 5/2020 | Ulrich |
| 2020/0168439 | A1 | 5/2020 | Bhutta et al. |
| 2020/0176234 | A1 | 6/2020 | Abraham et al. |
| 2020/0411290 | A1 | 12/2020 | Oliveti |
| 2021/0050185 | A1 * | 2/2021 | Martinez ........... H01J 37/32155 |
| 2021/0082666 | A1 * | 3/2021 | Zhao ................. H01J 37/32183 |
| 2021/0082667 | A1 * | 3/2021 | Zhao ................. H01L 21/31116 |
| 2021/0217588 | A1 | 7/2021 | Savas et al. |
| 2022/0028659 | A1 | 1/2022 | Zhao et al. |
| 2022/0076923 | A1 | 3/2022 | Carroll et al. |

OTHER PUBLICATIONS

PCT International Search Report and Written Opinion, International Application No. PCT/US2023/027158, dated Jul. 7, 2023, 10 pages.
PCT International Search Report and Written Opinion, International Application No. PCT/US2020/042725, dated Nov. 5, 2020, 14 pages.

* cited by examiner

PLASMA PROCESSING WITH BROADBAND RF WAVEFORMS

CROSS-REFERENCE TO RELATED APPLICATIONS

This application is a continuation of U.S. application Ser. No. 17/865,225 filed on Jul. 14, 2022, which application is hereby incorporated herein by reference.

This application is related to U.S. application Ser. No. 16/572,708 (U.S. Pat. No. 11,170,981 B2) filed on Sep. 17, 2019, U.S. application Ser. No. 16/717,024 (U.S. Pat. No. 11,295,937 B2) Dec. 17, 2019, U.S. application Ser. No. 17/498,063 (U.S. Pat. No. 11,830,709B2) filed on Oct. 11, 2021, and U.S. application Ser. No. 17/012,168 (U.S. Pat. No. 11,348,761 B2) filed on Sep. 4, 2020, which are incorporated by reference in their entireties.

TECHNICAL FIELD

The present invention relates generally to a system for plasma processing, and, in particular embodiments, to a system for plasma processing with broadband radio frequency (RF) waveforms.

BACKGROUND

The integrated circuit (IC) is a network of circuit components in a monolithic structure comprising electronic device and interconnect elements that include intricate three-dimensional structures with nanoscale features. Plasma processing is used extensively for fabricating ICs. Generally, the structures are formed by sequentially depositing and patterning various layers using lithography and etching. Plasma deposition and etch processes used to fabricate components for sub-10 nm technology nodes need to control dimensions at almost the atomic scale across a 300 mm wafer. Many relevant structural features such as line edge roughness (LER), sidewall angle at high aspect ratios, film thickness, liner conformality, void-free fill, and etch selectivity are affected by the plasma properties; hence, the plasma needs to be precisely controlled. Scaling makes it difficult to provide the precision with the constraint of exciting plasma using simple continuous wave (CW) RF signals. Innovative processing methods, including cyclic processes, have been developed to overcome some of the hurdles. These may need intricate time-varying plasma properties to enhance the process capability. Complex and dynamic processing require complex RF waveforms to excite plasma with the requisite characteristics. Often, two RF waveforms are applied concurrently to two electrodes or superposed at a single electrode. The superposed waveform has RF power distributed over a range of frequencies. Clearly, plasma systems using broadband RF waveforms facilitate innovative plasma processing, and further advancement in broadband plasma systems is desired to successfully deploy the novel processes.

SUMMARY

A plasma system includes a plasma apparatus including: a plasma chamber; a pedestal configured to hold a substrate in the chamber; and a radio frequency (RF) electrode configured to excite plasma in the chamber; an electromagnetic (EM) circuit block coupled to the RF electrode, the EM circuit block including: a function generator configured to output a broadband RF waveform, the waveform having EM power distributed over a range of frequencies; a broadband amplifier coupled to an output of the function generator, an operating frequency range of the amplifier including the range of frequencies; and a broadband impedance matching network having an input coupled to an output of the broadband amplifier and an output coupled to a terminal of the RF electrode, an operating frequency range of the broadband impedance matching network including the range of frequencies; and a controller configured to adjust an input parameter of the EM circuit block.

A plasma system includes a plasma apparatus; a dual-channel electromagnetic (EM) circuit block including: a first EM circuit block including a first function generator, a first broadband amplifier, and a first broadband impedance matching network, where the first EM circuit block outputs a first broadband RF waveform coupled to the plasma apparatus, the first broadband RF waveform having EM power distributed over a first range of frequencies; and a second EM circuit block including a second function generator, a second broadband amplifier, and a second broadband impedance matching network, where the second EM circuit block outputs a second broadband RF waveform coupled to the plasma apparatus, the second broadband RF waveform having EM power distributed over a second range of frequencies, the second range being different from the first range; and a controller configured to adjust a plurality of input parameters of the EM circuit block.

A method of operating a plasma processing system, the method includes, at an output of a function generator, outputting a broadband radio frequency (RF) waveform; coupling the output of the function generator to an input of a broadband amplifier; at an output of the broadband amplifier, outputting an amplified broadband RF waveform; coupling the output of the broadband amplifier to a source end of a first RF-pipe; coupling a load end of the first RF-pipe to an input of a broadband impedance matching network, the load end being opposite the source end; and using a second RF-pipe, coupling an output of the broadband impedance matching network to a terminal of an RF electrode of a plasma apparatus, the coupling providing EM power at the RF electrode that excites plasma in a plasma chamber of the plasma apparatus.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1A:
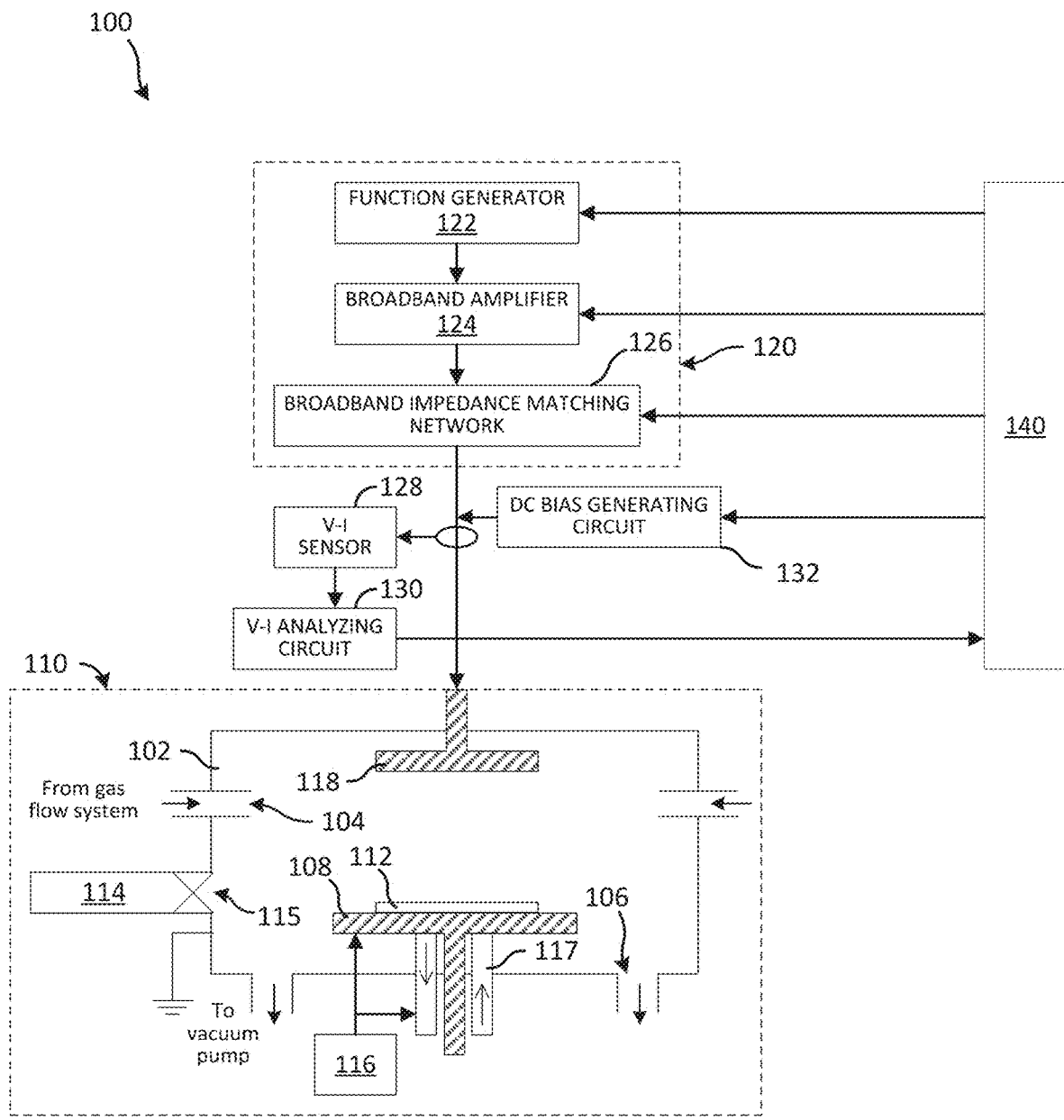
FIG. 1A illustrates a schematic of a broadband plasma system comprising a cross-sectional view of a plasma apparatus and a block diagram of an electromagnetic (EM) system providing EM power to the plasma apparatus, in accordance with some embodiment.

This disclosure describes embodiments of a system for plasma processing, where broadband radio frequency (RF) waveforms may be used to excite plasma. Broadband RF waveforms have electromagnetic (EM) power distributed over a range of frequencies in the RF band. The plasma processing system comprises a plasma apparatus for exciting plasma to process a substrate, an EM circuit block to provide EM power to the plasma apparatus, and a controller to adjust input parameters of the EM circuit block. In the embodiments in this disclosure, the EM power to the plasma apparatus may be provided as broadband arbitrary RF waveforms comprising continuous wave (CW) RF, pulsed RF, DC, pulsed DC, a high frequency rectangular (e.g., square wave) or triangular (e.g., sawtooth) pulse train, or a combination or superposition of more than one such waveform.

Generally, plasma processing involves modifying an exposed surface of the substrate physically and/or chemically with energetic particles (e.g., ions and radicals) that are electronically excited in the plasma. As mentioned in the background section, the broadband plasma system is a processing platform that provides the flexibility of implementing a variety of innovative techniques such as concurrent deposition and etch, cyclic processes alternating between deposition and etch or isotropic etch and anisotropic etch, and adaptive processing, where the plasma is adjusted dynamically when, for example, a different material gets exposed to plasma during processing. In order to implement such dynamic plasma processes, the plasma system has to excite plasma having plasma properties that are altered in a sequence necessary to achieve a sequence of process conditions specified for the process. In order to excite plasma with accurate and dynamically adjustable properties, complex broadband RF waveforms may have to be applied using a broadband plasma system.

Plasma properties, such as plasma density, ion energy and angle distributions, electron temperature ($T_e$), and a ratio of radical to ion flux, depend not only on the RF power and frequency but also on details of the waveform. The RF waveforms are selected to obtain desired plasma properties, and may be applied in a specific sequence, for example, to vary the plasma during cycling. As mentioned above, a broadband waveform may comprise pulsed RF, a superposition of sinusoidal RF with DC or pulsed DC, RF pulses of multiple frequencies, and non-sinusoidal waveforms such as sawtooth and square wave. Different RF waveforms may be applied to different electrodes that are coupled to plasma excited in a plasma processing chamber. For example, a first electrode may be coupled to a pulsed sinusoidal waveform at a high RF frequency, while a second electrode is coupled to a low frequency sinusoid superposed on a pulsed-DC waveform.

Traditionally, plasma is excited by a CW RF signal provided at a single frequency. In contrast, an arbitrary RF waveform may be a broadband RF waveform, having a power spectrum spanning a range of frequencies. A superposition of two waveforms having power spectral densities in two respective frequency bands has a combined power spectral density that is a superposition of the two bands. The superposed waveform may have power in a broad band formed by a superposition of two overlapping bands. In some cases, for example, a superposition of a low RF frequency bias waveform on a high RF frequency source waveform may carry power in non-overlapping bands. Some other waveforms, such as modulated sinusoids, e.g., amplitude modulated or frequency modulated waveforms have power distributed over a band of frequencies.

FIG. 1A shows a schematic representation of an example broadband plasma system 100. The example broadband plasma system 100 comprises an example plasma apparatus 110, an example EM circuit block 120 providing EM power to the plasma apparatus 110, and a controller 140 for adjusting the input parameters of the EM circuit block 120. The controller 140 may be a microcontroller, processor, and other programmable circuits and may be programmed accordingly, for example, by storing instructions in a memory that can be executed by the processing circuitry of the controller 140. In addition, the plasma system 100 includes a voltage and current (V-I) sensor 128 and V-I analyzing circuit 130, and a DC bias generating circuit 132. The DC bias generating circuit 132 may also be adjusted by the controller 140. The plasma apparatus 110 is shown in a cross-sectional view, and a block diagram illustrates the EM circuit block 120.

The plasma apparatus 110 comprises a main vacuum chamber, referred to as a plasma chamber 102, and a gas flow system that is coupled to the plasma chamber 102. The gas flow system is equipped with sensors, valves, and pumps etc. to control the pressure and flow of gas through the chamber 102. The gas flow system is configured to flow in a mixture of process gas and carrier gas through gas inlets 104 of the chamber 102 and remove excess gas and gaseous byproducts through exhausts 106, coupled to vacuum pumps of the gas flow system. A pedestal 108, configured to hold a substrate 112 (e.g., a semiconductor wafer), is included in the plasma apparatus 110. The pedestal 108 and the substrate 112 are shown inside the plasma chamber 102, where the substrate 112 is processed. The substrate 112 may be loaded from a load-lock 114 through a loading window 115 and positioned on the pedestal 108 for processing. Generally, a temperature of the substrate 112 is controlled during processing by an external temperature control system 116 comprising heating and cooling hardware such as the cooler liquid columns 117 coupled to the pedestal 108.

The apparatus 110 further comprises RF electrodes that are configured to receive EM power to excite a gas discharge plasma. In the example illustrated in FIG. 1A, the plasma apparatus 110 is configured to excite direct plasma inside the chamber 102 with electrodes configured to provide EM power to plasma by capacitive coupling. Typically, a disk-shaped electrode, is used for exciting plasma in chamber 102 when the plasma apparatus 110 is in a capacitively coupled plasma (CCP) configuration. In some embodiments, the RF electrode is a disk-shaped electrode in an upper portion of the chamber 102, referred to as an upper electrode 118. In the embodiments described in this disclosure, the pedestal 108 may be used both as a substrate holder and as a disk-shaped RF electrode, sometimes referred to as a lower electrode. In order to function as an RF electrode, the pedestal 108 is configured to include a disk-shaped conductive part, which is typically at the top of the pedestal in contact with the substrate 112. The diameter of the lower electrode, which is conductive part of the pedestal 108 (not shown explicitly) is roughly the same as that of the upper electrode 118 or, in some embodiments, relatively smaller.

In some other embodiments, the direct plasma may be excited with the plasma apparatus 110 in an inductively coupled plasma (ICP) configuration, where the electrode supplying EM source power to plasma is an antenna disposed outside the plasma chamber 102. The antenna may be of various shapes, for example, a spiral coil-shaped electrode placed over an insulating (e.g., quartz) window in a ceiling of the plasma chamber 102 or a helical coil around an insulating portion of a curved sidewall of a cylindrical plasma chamber 102.

Generally, a conductive portion of the walls of the plasma chamber is coupled to a reference potential, referred to as ground. In various embodiments, the upper electrode 118 and the lower electrode, which is the pedestal 108, may be coupled to either a waveform providing EM source power or a waveform providing EM bias power. Typically, plasma is ignited using EM source power, whereas the EM bias power is used to tailor the plasma properties of the gas discharge. In addition, the electrodes may be coupled to a DC or pulsed DC bias. In some configurations, for example, the configuration illustrated in FIG. 1A, an electrode (e.g., the pedestal 108) of the apparatus 110 may be grounded or floating.

The example EM circuit block 120 of the example broadband plasma system 100, shown schematically in FIG. 1A, comprises an adjustable function generator 122, a broadband amplifier 124, and an adjustable broadband impedance matching network 126. As described in detail below, the EM circuit block 120 provides a high power, broadband RF waveform at the upper electrode 118 of the plasma apparatus 110 to excite plasma in the chamber 102. The adjustable function generator can be an arbitrary function generator or even an arbitrary waveform generator with which a non-periodic waveform can be generated.

It is noted that, in the block diagrams of the EM circuit blocks, the various components are connected schematically by straight lines but, in the physical system, the high power RF waveforms may be coupled using coaxial RF-pipes. The RF waveform in an RF-pipe refers to an RF voltage waveform and an RF current waveform, where the voltage is the potential of an inner conductor relative to an annular outer conductor of the RF-pipe, and the current is the current in the inner conductor that is equal and opposite the current in the outer conductor. Typically, the outer conductor, also referred to as shield, is coupled to ground (the reference potential). The voltage and current are related by an impedance, which is generally frequency-dependent and position-dependent, over lengths comparable to a wavelength of the EM wave in the RF-pipe.

As illustrated in FIG. 1A, the signal path originates at the function generator 122, coupling a low-power RF waveform to an input of the amplifier 124. The signal path for the high power, amplified RF waveform is a first RF-pipe (shown schematically by a line) from an output of the amplifier 124 to an input of the impedance matching network 126. A second RF-pipe from the output of the impedance matching network 126 couples the RF waveform to a terminal of the upper electrode 118. As explained in further detail below, the impedance of the impedance matching network 126 may be adjusted to adjust the high power, broadband RF waveform at the terminal of the upper electrode 118 to maximize the EM power there. Generally, the impedance depends not only on the components of the impedance matching network 126 (e.g., adjustable inductances and capacitances) but also on the spectrum (i.e., frequencies) of the broadband RF waveform. Hence, the RF waveform at the terminal of the upper electrode 118 is adjusted by synchronously configuring the variable inductances and capacitances of the impedance matching network 126 and the spectrum of the broadband RF waveform output by the adjustable function generator 122 by sending appropriate control signals from the controller 140.

The function generator 122 is capable of generating an arbitrary waveform in the radio frequency range using appropriate digital and analog circuitry such as oscillators, pulse generators, modulators, combiners, and the like. The DC bias generating circuit 132 is capable of generating a constant DC bias or a pulsed DC bias waveform using, for example, a DC power supply and a chopper driven by a pulse train from a pulse generator. As explained above, while the power spectral density of a CW sinusoidal signal is concentrated at a single frequency, the power carried by a more complex waveform is distributed over a band of frequencies. In various embodiments, the frequencies may be from about 100 kHz to about 300 MHz. The waveform used to provide EM source power have a power spectrum that is, usually, at the higher end of this range, for example from about 10 MHz to about 300 MHz, and the power spectral density of the waveform providing EM bias power is, typically, in a band that falls in a lower frequency range of about 100 kHz to about 13 MHz.

The waveform at the output of the function generator 122 is coupled to the input of the broadband amplifier 124. In certain embodiments, the broadband amplifier 124 is a linear power amplifier that provides a high output power of about 50 W to about 10 kW with low harmonic distortion, for which the waveshape of the input signal is preserved in the amplified output signal. Typically, linear amplifiers exhibit a tradeoff between bandwidth and power amplification, which makes it difficult and costly to provide a single-channel that has both high bandwidth and high power amplification. For example, consider a power gain ($G_P$) vs. frequency (f) plot of an amplifier, where $G_P$ is a constant, $G_{Po}$, up to a cutoff frequency, $f_c$ (the bandwidth of the amplifier), beyond which $G_P$ drops, typically, at a rate of 20 dB/decade. While $G_P$ and $f_C$ may be adjusted with a negative feedback loop, the product ($G_{Po} f_C$) is fixed. Accordingly, although one may use a wide bandwidth amplifier (100 kHz to 300 MHz) for both EM bias power and EM source power, the wider frequency range would be at the cost of a lower power gain, or loss of linearity, which requires the gain to be constant across the entire frequency range. Hence, in the embodiments described in this disclosure the broadband amplifiers (e.g., the amplifier 124 in EM circuit block 120) have an operating frequency range that includes either the lower frequency range for EM bias power, which may be 100 kHz to 13 MHz, or the higher frequency range for EM source power, which may be 10 MHz to 300 MHZ, instead of the wider range (from 100 kHz to 300 MHz) of frequencies in which EM power (including EM source power and EM bias power) may be used by a plasma apparatus to process a substrate. In one or more embodiments, the broadband amplifier 124 may be implemented as the broadband RF power amplifier as described in application Ser. No. 16/572,708 (e.g., FIGS. 2, 6).

The example plasma apparatus 110, illustrated in FIG. 1A, is using EM source power provided through the broadband impedance matching network 126 and a DC bias provided by the DC bias generating circuit 132. In this example, the apparatus 110 is not using EM bias power. Accordingly, in the block diagram illustrated in FIG. 1A, the broadband amplifier 124 may be designed to operate in a band suitable for amplifying the EM source waveform without distortion, for example, the 10 MHz to 300 MHz band.

In the broadband plasma systems described in this disclosure, the adjustable function generator, such as the function generator 122 in the example plasma system 100, generates a periodic function, for example, a sinusoid whose characteristics such as amplitude and frequency may be adjusted during the process. For example, the function generator may output a frequency modulated waveform, i.e., a sinusoid whose instantaneous frequency, f, is varied periodically from a low value to a high value with a period $T_P$. This implies that f is adjusted periodically from ($f_C-\Delta f$) to ($f_C+\Delta f$), where $f_C$ is a center frequency and $\Delta f$ is a frequency deviation around $f_C$. The bandwidth, BW, of this waveform may be approximated by Carson's formula: BW=2($\Delta f+1/T_P$). For example, if $f_C$=13.56 MHz, $\Delta f$=1 MHz, and $T_P$=10 μs then BW=2.2 MHz, and the power is distributed over a frequency range from 12.46 MHz to 14.46 MHz. In another example, the function generator 122 may generate a rectangular or triangular (e.g., sawtooth) pulse train whose characteristics such as ramp rate, pulse height, period, and duty cycle may be adjusted during the process. The bandwidth of the pulse train would depend on its timing characteristics.

It is noted that, from experiments performed by the inventors, it has been discovered that if the instantaneous frequency is not varied smoothly; for example, if f is changed abruptly in discrete steps such as in a staircase function then the resulting gas discharge plasma may flicker (turn on and off) uncontrollably. The flicker increases process variability, which is undesired. On the other hand, the flicker may be avoided if the modulating function smoothly varies f as, for example, in a triangular or sinusoid function. Accordingly, in the embodiments described in this disclosure, the signals providing power to the plasma apparatus (e.g., the plasma apparatus 110) are generated using, for example, a function generator, where signal processing circuitry adjusts the signal frequency relatively smoothly. In contrast, digital signal generators generally use circuitry that adjusts signal frequency in an abrupt stepwise fashion. In some embodiments, the smooth change in frequency may be achieved using analog signal processing techniques. In addition to changing f smoothly, function generators and analog signal generators can provide a smooth power adjustment without flickering. On the other hand, digital signal generators usually have stepwise power adjustment, which also induces flickering.

A plasma system (e.g., the plasma system 100 in FIG. 1A) is similar to a simple power system comprising a power source, a load, a transmission line, and an impedance matching network.

The power source is the broadband amplifier (e.g., the broadband amplifier 124), considered as an ideal power supply in series with a source impedance equal to an output impedance of the amplifier. Typically, the output impedance is a standard impedance such as 50Ω. The load is the plasma apparatus (e.g., the plasma apparatus 100), where the load impedance is an impedance between the terminal of the RF electrode (e.g., the upper electrode 118) to which power is delivered and ground.

In a plasma system, the transmission line may be a coaxial first RF-pipe that may be approximated by a lossless transmission line and modeled as a two-port network, an input port and an output port. One end of the first RF-pipe, referred to as the source end, is the input port coupled to an output of the broadband amplifier. The characteristic impedance of the RF-pipe may be selected to be the same as the output impedance of the amplifier (e.g., 50Ω). The output port is the opposite end of the first RF-pipe, referred to as the load end. In plasma systems, described in this disclosure, the load end is coupled to an input of a broadband impedance matching network. The output of the impedance matching network is coupled to the load at a terminal of an RF electrode of the plasma apparatus by a second RF-pipe, the load impedance being the impedance between the terminal and ground. As explained further below, the second RF-pipe has a short length such that the RF-pipe is an ideal connection. In other words, the input impedance of the short RF-pipe measured at one end is equal to the impedance connected at the opposite end, the length of the short pipe being short relative to a wavelength of the EM wave in the RF-pipe.

The purpose of inserting the impedance matching network between the load impedance and the load end of the first RF-pipe is to adjust the impedance at the load end in order to transfer as much power as possible from a power source to a load. The broadband impedance matching network, having variable circuit components, is able to achieve the efficient power transfer over the range of frequencies of the power spectrum of the broadband RF waveform. An example broadband impedance matching network is described in further detail below.

In the plasma system 100, the output of the amplifier 124 is coupled to the input of the impedance matching network 126 via the first RF-pipe, and the output of the impedance matching network 126 is coupled to a terminal of the upper electrode 118 of the plasma apparatus 110 via a second RF-pipe, as illustrated in FIG. 1A. The output terminal of the impedance matching network 126 is positioned close to the terminal of the upper electrode 118 in order to avoid any transmission line impedance in the signal path after the impedance matching network 126. Typically, the impedance of an RF-pipe of length, l, is small enough to be ignored if $l<\lambda/8$, where $\lambda$ is a representative wavelength of the broadband RF waveform in the RF-pipe. It is noted that the system design should ensure that a short second RF-pipe is used between the impedance matching network and the electrode, especially if the second RF-pipe is carrying high frequency (short $\lambda$) EM source power, as is the case in the plasma system 100 in FIG. 1A.

The V-I sensor 128 in FIG. 1A comprises a V-I sensor assembly comprising a voltage pickup and a current pickup that sense a time-varying electric field (E-field) and a time-varying magnetic field (H-field), respectively. In the plasma system 100, the V-I sensor 128 is positioned such that its voltage pickup and current pickup are at a location along the second RF-pipe coupling the impedance matching network 126 to the upper electrode 118, as illustrated in FIG. 1A. Here, a short RF-pipe is used for the signal path. This places the V-I sensor 128 close to the terminal of the upper electrode 118 so that the measured RF voltage waveform and RF current waveform closely approximate the respective waveforms at the terminal of the upper electrode 118.

Figure 1B:
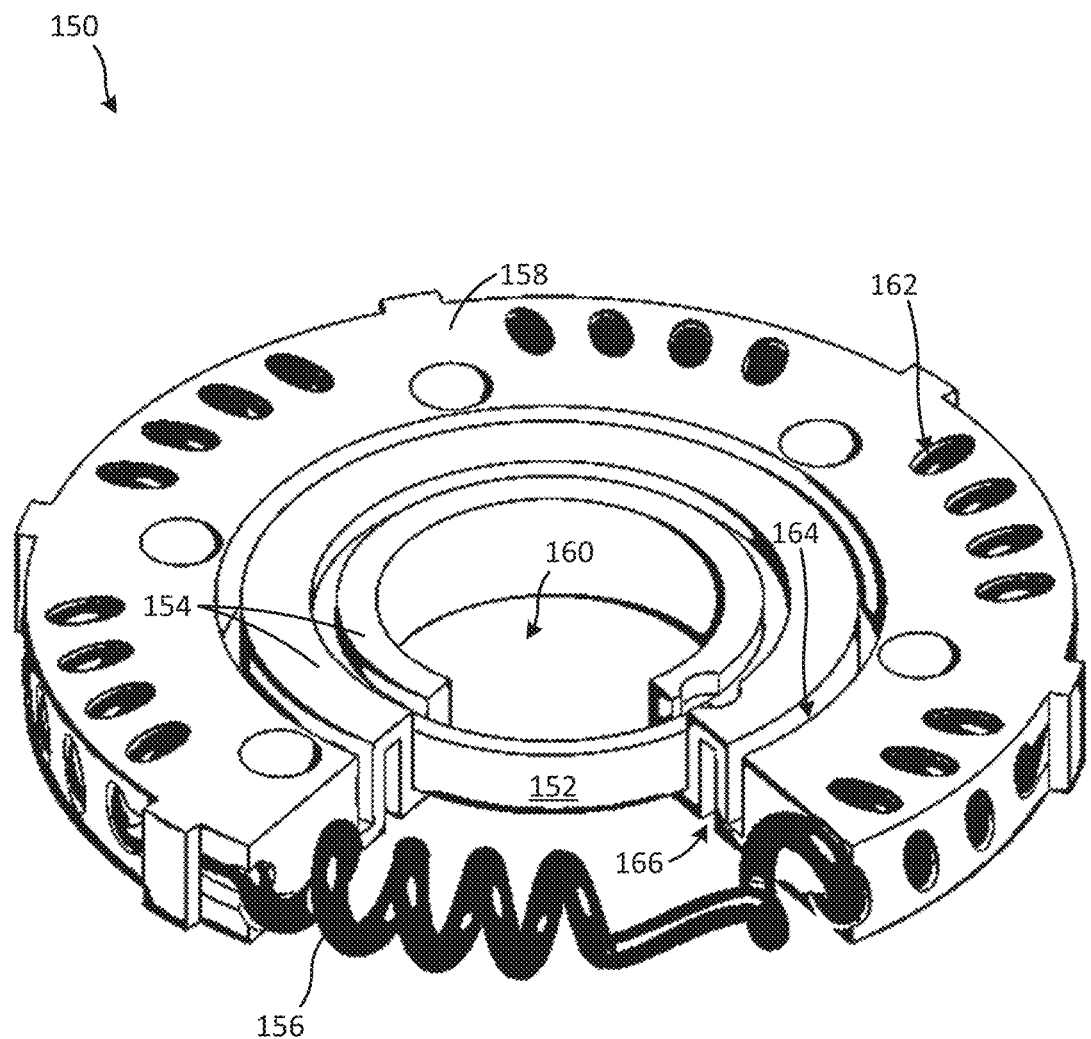
FIG. 1B illustrates a cutout of a V-I sensor showing an example voltage pickup and current pickup, in accordance with some embodiment.

For illustrative purposes, FIG. 1B illustrates an example V-I sensor assembly, for example, as described in FIG. 3C of co-pending application Ser. No. 17/514,815 filed on Oct. 29, 2021, which application is incorporated herein by reference in entirety.

FIG. 1B illustrates a cutout of an example V-I sensor assembly 150 comprising a conductive voltage pickup 152, held by an insulating voltage pickup holder 154, and a conductive current pickup 156, supported by an insulating toroidal mandrel 158. The second RF-pipe is not shown in FIG. 1B for clarity: The inner conductor of the second RF-pipe would be a cylindrical conductor passing through a hole 160, and the annular outer conductor would include a top conductive cover and a bottom conductive cover of the sensor assembly 150. The conductive covers and the inner and outer conductors of the second RF-pipe are not shown in FIG. 1B.

The voltage pickup 152 is a ring around the inner conductor that generates a signal proportional to a radial E-field between the inner conductor and outer conductor of the second RF-pipe by capacitive coupling.

The current pickup 156 is a wire threaded along a hollow passage 162 that coils around a circular axis inside the toroidal mandrel 158, as illustrated in FIG. 1B. Typically, the H-field has negligible impact on the signal output of the voltage pickup 152, but the perturbation of the radial E-field on the current pickup 156 may not be ignored. Hence, an E-field shielding scheme is included in the sensor assembly 150. The E-field shielding is provided by a conductive protrusion from the top cover and a conductive protrusion from the bottom cover of the sensor assembly 150 that may be positioned inside slots 164 and 166, respectively. The conductive protrusions are grounded by being a portion of the top and bottom covers; hence, being a portion of the grounded outer conductor of the second RF-pipe. The grounded conductive protrusions shield the current pickup 156 from the E-field but not from the H-field because the insulating walls of the slots 164 and 166 prevent any ground current from flowing in the two conductive protrusions. Thus, the current pickup 156 is a half-loop inside the second RF-pipe that senses the time-varying H-field circulating around the inner conductor by inductive coupling.

In this example, the voltage pickup 152 and the current pickup 156 are positioned symmetrically around the central axis of the second RF-pipe (i.e., the central axis of the hole 160). The symmetry provides higher measurement accuracy by taking advantage of cancellation of some of the parasitic voltages and currents induced in the conductive pickups.

Referring again to FIG. 1A, the measured RF voltage and RF current waveforms are transmitted by the V-I sensor 128 to the V-I analyzing circuit 130 using, for example, coaxial cables.

The V-I analyzing circuit 130 may comprise amplifiers (e.g., differential amplifiers) coupled to its inputs to receive and amplify the incoming RF voltage and RF current waveforms from the V-I sensor. The amplified waveforms may be analyzed by the V-I analyzing circuit 130 with electronic circuitry configured to extract relevant electrical characteristics from RF voltage and RF current waveforms and output an electronic feedback signal encoding the extracted electrical characteristics. Electrical characteristics extracted from the attributes of the RF voltage and RF current waveforms may include peak and rms values of voltage and current, instantaneous frequency, instantaneous power, average power, and power spectral density (from harmonic analysis). The electronic circuitry used to perform the analysis and extraction may be implemented as a separate signal processor, for example, a programmable digital signal processor. The feedback signal from an output buffer of the V-I analyzing circuit 130 may be coupled to an input port of the controller 140 for process monitoring and/or feedback control, as described further below.

In some embodiments, a DC bias (or pulsed DC) from a DC bias generating circuit 132 may also be superposed on the waveform of the terminal of the upper electrode 118, as illustrated schematically in FIG. 1A.

In the example illustrated in FIG. 1A, the load impedance is an impedance between the terminal of the upper electrode 118 and ground and, thus, includes an impedance of the plasma, when plasma is present in the chamber 102. It is not unusual to have a large mismatch between the source impedance (i.e., the output impedance of the amplifier 124) and the load impedance. Hence, it is common practice to insert an impedance matching network in the signal path between the load end of the first coaxial RF-pipe and the load. Without the impedance matching network 126, the mismatch would likely cause an undesirably low power to be transferred to the plasma apparatus 110.

At low f, $\lambda$ is large, and if l<$\lambda$/8 then the wave nature of the EM signal in the RF-pipe may be ignored, and the RF-pipe may be approximated by an ideal connection. But, as f is increased, $\lambda$ shrinks, because of which it may be erroneous to ignore the fact that the EM signal in the RF-pipe is an EM wave. In other words, the RF-pipe has to be modeled like a waveguide along which a transmitted EM wave travels from the source end to the load end and a reflected wave (reflected at the load end) travels in the opposite direction. A ratio of the amplitudes of the reflected wave to the transmitted wave is referred to as a reflection coefficient, $\Gamma$. If there is a large mismatch between the source impedance and the load impedance then a magnitude of the reflection coefficient ($|\Gamma|$) may be significantly high, resulting in poor power transfer to the plasma apparatus 110. Additionally, interference between the transmitted wave and the undesired reflected wave would result in standing wave patterns which, in some instances, may damage the amplifier 124. The impedance matching network 126 is used to suppress reflections and standing wave patterns in the first RF-pipe to efficiently transfer EM power to the load impedance, i.e., the impedance between the terminal of the RF electrode (e.g., the upper electrode 118) to which power is delivered and ground. As described in further detail below, the broadband impedance matching networks in the embodiments of plasma systems include variable inductors and capacitors to adjust an impedance of the matching network to achieve efficient power transfer in the frequency range of the power spectrum of the broadband RF waveform by suppressing reflections at the load end of the first RF-pipe such that $|\Gamma| \leq 0.6$.

Generally, an impedance matching network includes only approximately lossless circuit components (e.g., approximately ideal inductors, capacitors, and switches) to avoid undesired resistive power loss in the impedance matching network. In this disclosure, a circuit approximated by a network of ideal inductors, capacitors, and switches is referred to as a reactive circuit. For a specific circuit topology and a specific choice of the reactive components, the impedance of the matching network is a specific reactance function, $X_M(f)$. Other impedances in the power system are the output impedance of the amplifier 124, the transmission line impedance, and the load impedance (which includes the plasma impedance). In general, the power transferred to a given load impedance depends on the various impedances in the power system. Optimization of the power transferred to the load impedance implies optimizing the impedance of the impedance matching network, i.e., the reactance function $X_M(f)$). In other words, the inductances and capacitances of the matching network are selected with an objective to maximize the power to the load (i.e., the plasma apparatus 110, including the plasma) for a given broadband RF waveform (e.g., the output of the function generator 122).

In a conventional, single frequency (or narrow-band) system, impedance matching comprises designing an impedance matching network during the development process. After the inductors and capacitors of the matching network of the impedance matching network have been selected such that the power transferred to the load is maximum at the operating frequency (or the center frequency of the narrow band), the reactive elements are only altered in a narrow range during processing to compensate small variations in plasma processing conditions.

In a broadband system, such as the plasma system 100 in FIG. 1A, the operating frequency may be intentionally changed by a discrete magnitude during, for example, different cycles of a cyclic process. Additionally, a broadband system, such as plasma system 100, may be using an RF waveform where the frequency is varied continuously, for example, a frequency modulated sinusoidal waveform. Accordingly, the broadband impedance matching network 126 comprises one or more variable reactive components.

Figure 1C:
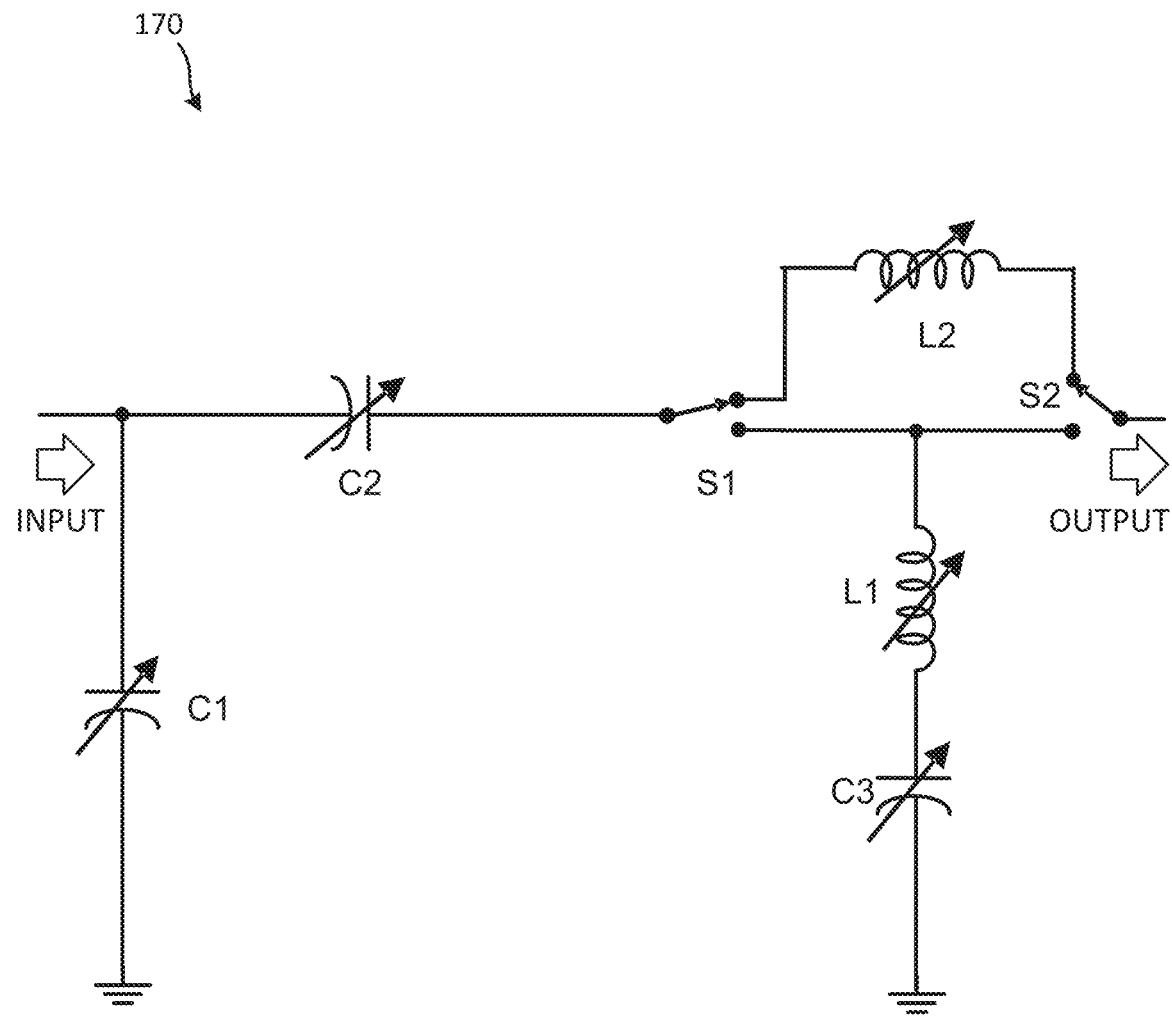
FIG. 1C illustrates a circuit schematic of an example reactive circuit used for a broadband impedance matching network, in accordance with some embodiment.

For illustrative purposes, FIG. 1C illustrates an example reactive circuit for forming the matching network 126, for example, as described in FIG. 29 of application Ser. No. 17/12,168 filed on Sep. 4, 2020, which is incorporated herein in reference.

FIG. 1C illustrates a schematic of an example reactive circuit 170 comprising three variable capacitors C1, C2, and C3 and two variable inductors L1 and L2. As explained above, because the reactive components C1, C2, C3, L1, and L2 may be altered during processing, the reactive circuit 170 may be implemented as the broadband impedance matching network 126. Furthermore, the reactive circuit 170 comprises two three-terminal switches S1 and S2 that provide additional control variables for adjusting the reactance of the reactive circuit 170. It is noted that the variable capacitors and inductors may comprise switched-capacitors and switched-inductors comprising a plurality of two-terminal switches, as explained in further detail below.

As illustrated in FIG. 1A, the impedance matching network 126 is inserted in the signal path between the output of the amplifier 124 and the terminal of the upper electrode 118. As mentioned above, a first RF-pipe may be coupling the output of the amplifier 124 to the input of the impedance matching network 126, indicated by a block arrow at the left side of the reactive circuit 170 in FIG. 1C. The output of the impedance matching network 126, indicated by a block arrow at the right side of the reactive circuit 170 in FIG. 1C may be coupled to the terminal of the upper electrode 118 by a short second RF-pipe. The inventors have demonstrated $|\Gamma| \leq 0.6$ across an operating frequency range of 13.56 MHz to 220 MHz in a plasma system, where the reactive circuit 170 has been implemented for the broadband impedance matching network.

Variable capacitors C1, C2, and C3 may be realized in several ways. Mechanically variable capacitors may comprise movable parts such as the plates of a tuning capacitor. For example, the distance and/or the overlapping area of the two plates of the capacitor C1 may be adjustable through a suitable mechanical construction. Electrically variable capacitors such as varactors may be used as the variable capacitor C1, where the width of a depletion layer is varied by a bias voltage across a metal-oxide-semiconductor (MOS) capacitor or a p-n junction diode. Another method for realizing the electrically variable capacitor C1 may be using an array comprising a plurality of switched-capacitors connected in parallel. Each switched-capacitor comprises a capacitor and a two-terminal switch connected in series. The capacitance of the capacitor C1 may be adjusted by controlling the states of the two-terminal switches of the plurality of switched-capacitors. In some embodiments, the capacitance of the variable capacitor (e.g., C1, C2, and C3) may be able to vary in a range from about 3 pF to about 4000 pF.

Variable inductors L1 and L2 may also be realized in several ways. For example, analogous to the electrically variable capacitor C1 implemented by an array of switched-capacitors, the variable inductor L1 may be implemented as an array of switched-inductors connected in series. Each switched-inductor comprises an inductor and a two-terminal switch connected in parallel. The inductance of the inductor L1 may be adjusted by controlling the states of the two-terminal switches of the plurality of switched-inductors. Alternatively, the variable inductor L1 may have its inductance changed by mechanical motion. For example, the coupling between the magnetic core and the coil of the first inductor L1 may be adjustable through a suitable mechanical construction. In some embodiments, the inductance of the variable inductor (e.g., L1 and L2) may be able to vary in a range from about 50 nH to about 20 µH.

Similar to the broadband amplifiers, the broadband impedance matching networks in the embodiments in this disclosure are designed for an operating frequency range, which may be either the higher frequency range of about 10 MHz to about 300 MHz or the lower frequency range of about 100 kHz to about 13 MHz. The broadband impedance matching network 126 is designed for waveforms used to supply EM source power; hence, the impedance matching network 126 covers the 10 MHz to 300 MHz frequency range. However for waveforms providing EM bias power, an impedance matching network covering the lower frequency range of 100 kHz to 13 MHz would be used.

The adjustments to the matching network of the impedance matching network 126 may be performed using the controller 140, illustrated schematically in FIG. 1A. The controller 140 may be configured to transmit control signals to adjust the inductance and capacitance of the variable inductors and capacitors of the broadband impedance matching network 126, thereby, adjusting the waveform at the load terminal (the terminal of the upper electrode 118 in the plasma apparatus 110). Additionally, finer adjustments to the impedance of the impedance matching network 126 may be made by the controller 140 at the function generator 122 by adjusting the waveshape (e.g., the frequency) of the broadband RF waveform. The function of the controller 140 is explained in further detail below.

As mentioned above, the V-I sensor 128 may be positioned in the RF pipe in the section between the output of the impedance matching network 126 and the terminal of the electrode 118 to measure the RF voltage and RF current waveforms being delivered to the plasma apparatus 110 and transmit the data to the V-I analyzing circuit 130. The V-I analyzing circuit 130 may be configured to extract relevant electrical characteristics from the waveforms and output an electronic feedback signal encoding the extracted electrical characteristics. The feedback signal from the V-I analyzing circuit 130 may be coupled to the controller 140 for process monitoring and/or feedback control. The electrical characteristics received from the V-I analyzing circuit 130 may be stored in a memory device and processed by a processor. Based on the feedback, the processor may instruct the controller 140 to generate appropriate control signals to be transmitted to various components of the EM circuit block 120 and the DC bias generating circuit 132 in order to adjust the RF voltage and RF current waveforms along with the impedance of the impedance matching network 126 between the output of the broadband amplifier 124 output and the load, which includes the plasma.

As described above, the controller 140 is used to adjust the broadband RF waveforms at the terminals of the RF electrodes of the plasma apparatus 110 by adjusting input parameters of the EM circuit block (e.g., the EM circuit block 120) and the optional DC bias generating circuits (e.g., the DC bias generating circuit 132) by transmitting control signals to respective input ports of the EM circuit block and the optional DC bias generating circuit.

As illustrated in FIG. 1A, in plasma system 100, the controller 140 may generate and transmit a plurality of control signals to adjust input parameters of the EM block 120 and the DC bias generating circuit 132 to adjust the broadband RF waveform comprising the RF voltage and RF current waveforms at the terminal of the upper electrode 118. The controller 140 may comprise a processor and a memory device, where data and coded instructions for the processor may be stored. The data comprises a process recipe and the electrical characteristics decoded from the feedback signal output by the V-I analyzing circuit 130, the feedback signal being received at an input port of the controller 140, as illustrated in FIG. 1A. The instructions, when executed by the processor, retrieve the data from the memory device and, based on the data, generate appropriate control signals, mentioned above.

In the example embodiment illustrated in FIG. 1A, a first, second, and a third output port of the controller 140 have been configured to transmit the first, second and third control signals, respectively, to synchronously adjust the input parameters of the function generator 122, the broadband amplifier 124, and the broadband impedance matching network 126. Additionally, a fourth control signal may be generated and transmitted from a fourth output port to adjust input parameters of the DC bias generating circuit 132, as illustrated in FIG. 1A. In some embodiments, the DC bias generating circuit 132 may be optional. Each control signal is transmitted from the controller 140 and coupled to an input port of the EM circuit block 120 or the optional DC bias generating circuit 132 using, for example, a coaxial cable. Collectively, these control signals synchronously adjust the input parameters of the EM circuit block 120 and the DC bias generating circuit 132 to adjust the broadband RF waveform providing EM power to the plasma apparatus 110. For example, the first control signal transmitted to the function generator 122 may adjust the spectrum (i.e., frequencies) of the RF waveform; the second control signal transmitted to the broadband amplifier 124 may adjust its power gain to adjust the amplitude of the RF waveform; and the third control signal transmitted to the broadband impedance matching network 126 may adjust a phase relationship between the RF voltage and RF current waveforms to adjust the EM power delivered at the terminal of the upper electrode 118. In some embodiments, where a DC bias generating circuit 132 is used, the fourth control signal transmitted to the DC bias generating circuit 132 may adjust the DC bias superposed on the RF waveform, such as the DC voltage, the pulsing frequency, and the duty cycle of DC pulses.

Some of the adjustments are specific to the process and specified in the process recipe stored in the memory device of the controller 140. For example, plasma system 100 may be executing a cyclic process alternating between an etch cycle and a deposition cycle, where the operating frequency, DC bias, and the RF source power may be specified to be different for the two cycles of the cyclic process. In addition to adjusting the power gain of the amplifier 124 and the output voltage of the DC bias generating circuit 132, execution of this process may require appropriate adjustments to be made synchronously to the function generator 122 and the broadband impedance matching network 126 to tune in the change in operating frequency at the beginning of each cycle of the cyclic process. Accordingly, the controller 140 may retrieve instructions from the recipe, execute the instructions using the processor to transmit control signals to adjust the variable inductors and/or capacitors in the broadband impedance matching network 126 and, simultaneously, transmit control signals to a frequency selector in the function generator 122 at the times specified in the instructions in the recipe.

In addition to the intentional variations of the waveform (e.g., the changes specified by the recipe), random variations can occur during processing. As explained above, the load impedance includes the plasma, when plasma is sustained in the chamber 102. Since the plasma properties may vary during the plasma process, in general, the load impedance may also vary during the process and cause undesired and random changes to the waveforms carrying EM power from the EM circuit block 120 to the plasma apparatus 110. Accordingly, additional adjustments for process control may be made by the controller 140 for waveform tuning and feedback control.

Figure 2:
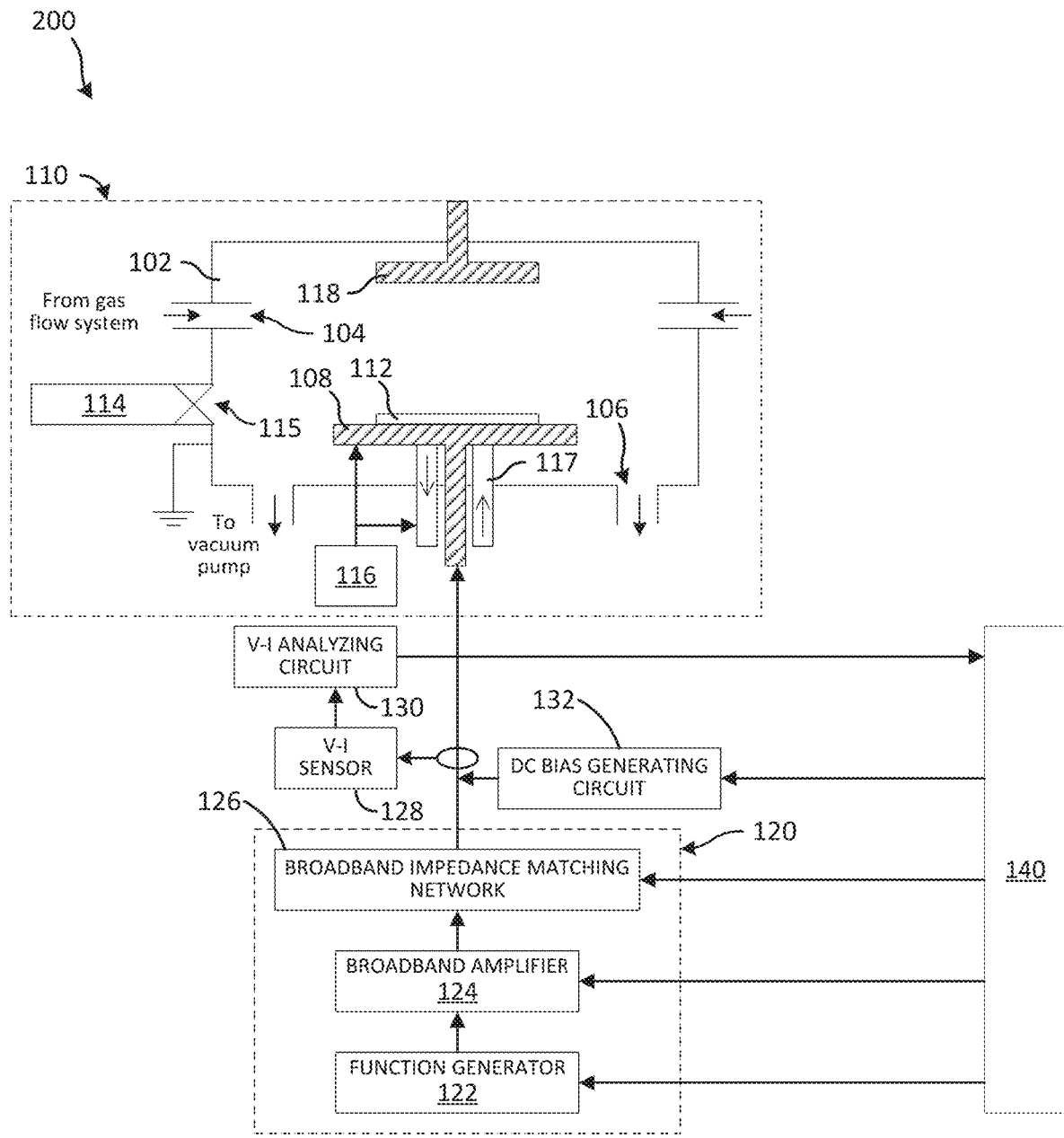
FIG. 2 illustrates a schematic of a broadband plasma system comprising a cross-sectional view of a plasma apparatus and a block diagram of an electromagnetic (EM) system providing EM power to the plasma apparatus, in accordance with some embodiment.

FIG. 2 illustrates a schematic representation of another broadband plasma system 200, similar to the example plasma system 100 described above with reference to FIG. 1A. In plasma system 200, the EM circuit block 120 supplies EM source power to the plasma apparatus 110 at the pedestal 108. As described above, a conductive portion of the pedestal 108 (the lower electrode) may be the RF electrode used to excite plasma in chamber 102. In the example embodiment in FIG. 2, the upper electrode 118 is present but is not being coupled to an RF or DC power supply. In some embodiments, there may not be an upper electrode present if an upper electrode is not needed. If, as illustrated in FIG. 2, the upper electrode 118 is present but is not used then it may be floating (open circuit) or grounded (i.e., coupled to the reference potential), or coupled to the chamber wall, which may be coupled to ground.

Figure 3:
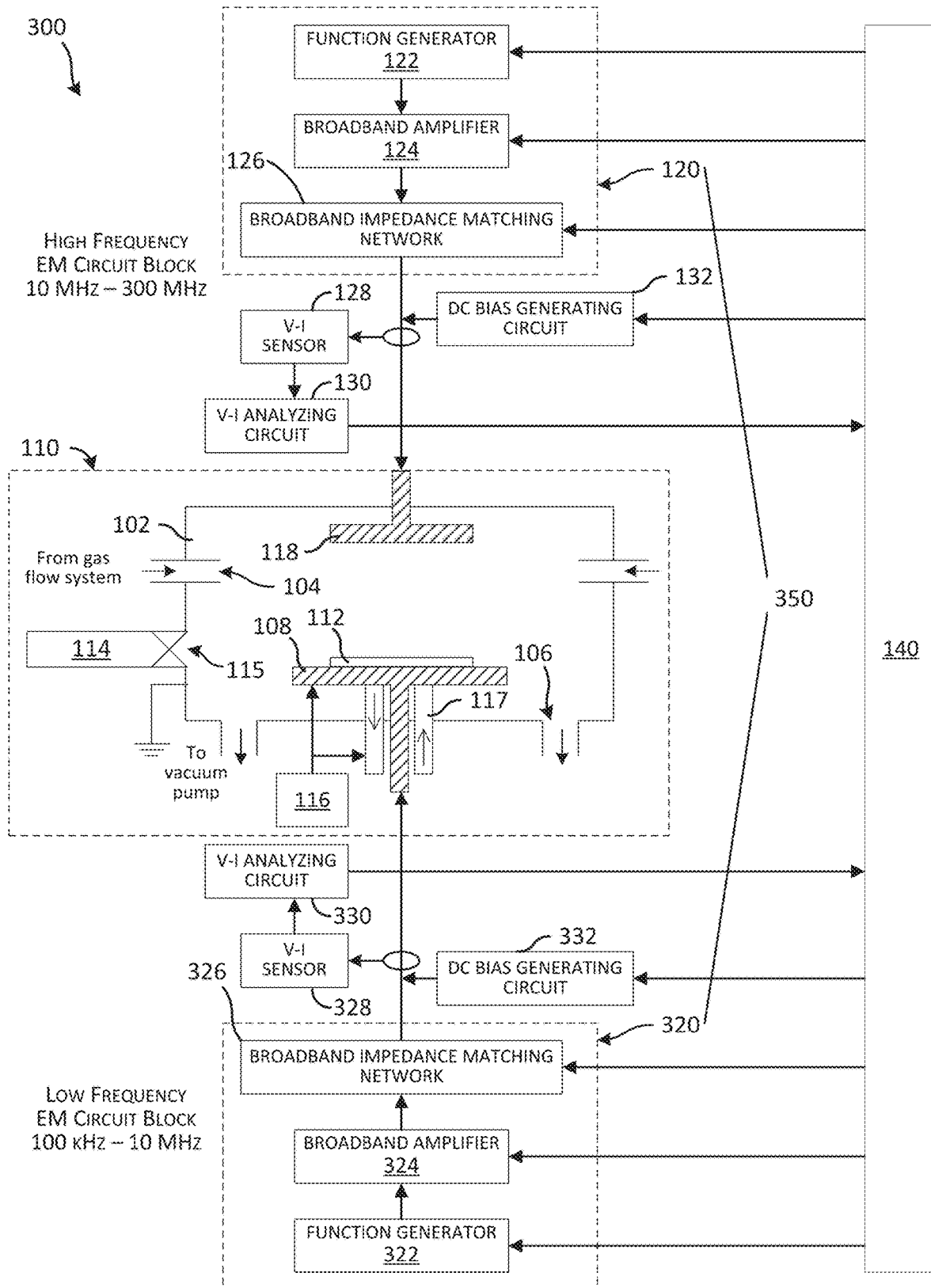
FIG. 3 illustrates a schematic of a broadband plasma system comprising a cross-sectional view of a plasma apparatus and a block diagram of an electromagnetic (EM) system providing EM power to the plasma apparatus, in accordance with some embodiment.
Figure 4:
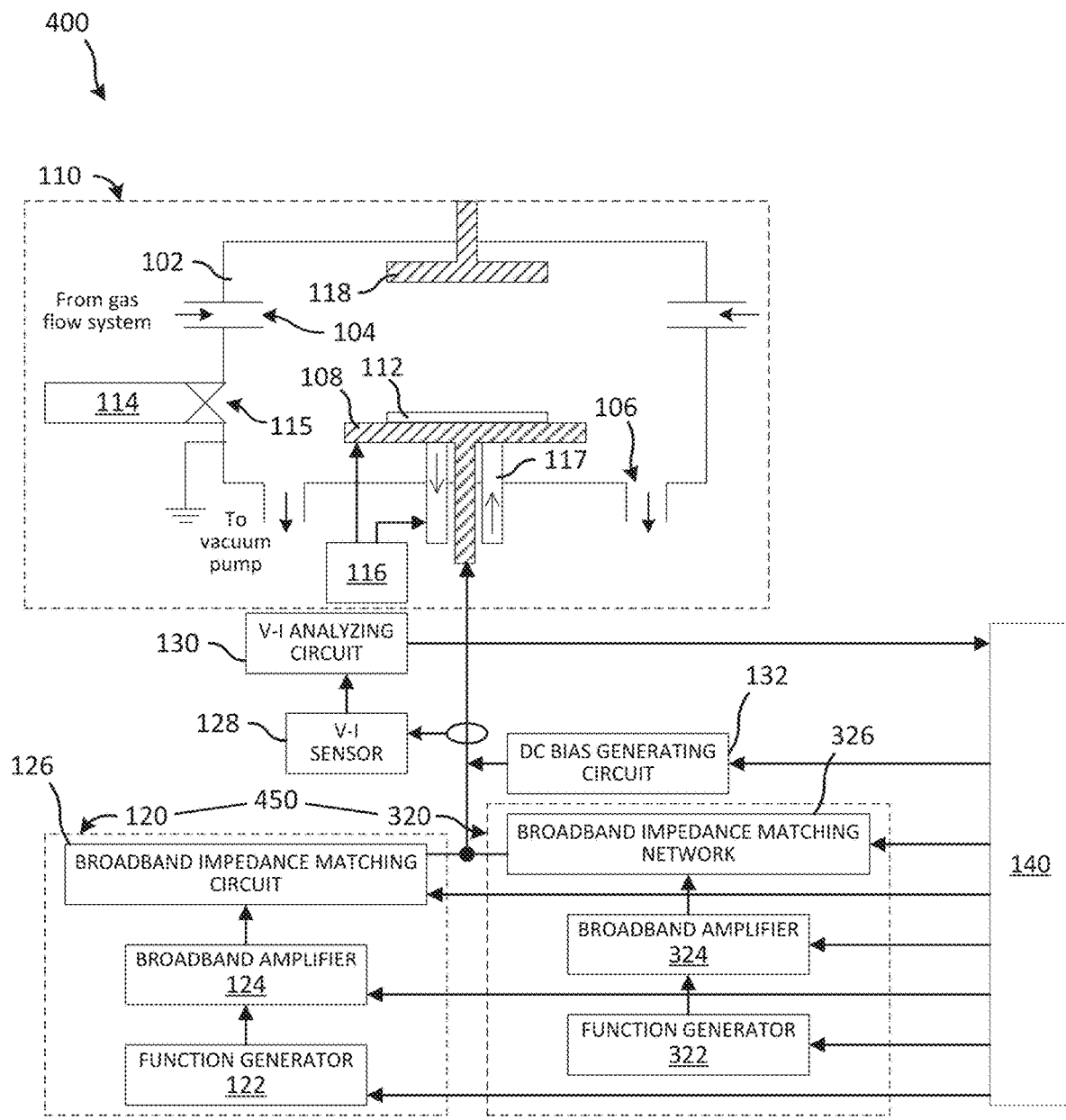
FIG. 4 illustrates a schematic of a broadband plasma system comprising a cross-sectional view of a plasma apparatus and a block diagram of an electromagnetic (EM) system providing EM power to the plasma apparatus, in accordance with some embodiment.

FIGS. 3 and 4 illustrate embodiments of a plasma system where the EM circuit block provides EM power to the plasma apparatus using several broadband RF waveforms. Plasma system 300 and plasma system 400, illustrated in FIGS. 3 and 4, respectively, are examples of embodiments where two broadband RF waveforms are simultaneously powering the plasma apparatus 110, described above with reference to FIG. 1A: A high frequency RF waveform provides the EM source power and a low frequency RF waveform provides the EM bias power.

The two broadband RF waveforms are generated using two single-channel EM circuit blocks to accommodate the wide frequency range (100 kHz to 300 MHz) that is generally used for RF waveforms carrying EM source power and EM bias power in plasma systems. As explained above, linear amplifiers exhibit a tradeoff between bandwidth and power amplification, which makes it difficult and costly for a plasma system to include a linear power amplifier having both high bandwidth (100 kHz to 300 MHz) and high power amplification (output power between 50 W to 10 kW). Thus, while a plasma system may include a multi-channel broadband amplifier for amplifying multiple broadband RF waveforms within a smaller frequency range (e.g., the 100 kHz to 13 MHz range for EM bias power or the 10 MHz to 300 MHz range for EM source power), it may be advantageous to use two single-channel EM circuit blocks, one for EM source power and another for EM bias power because of the high cost of a dual-channel broadband amplifier that can provide high power with low distortion over the wide range of frequencies of the various RF waveforms used simultaneously in plasma processing.

FIGS. 3 and 4 illustrate the example plasma systems 300 and 400, wherein the respective EM circuit blocks 350 and 450 are dual-channel EM circuit blocks comprising two single-channel EM circuit blocks, each channel used for one broadband RF waveform. A first EM circuit block 120 may be for a higher frequency broadband RF waveform and a second EM circuit block 320 may be for a lower frequency broadband RF waveform. Each single-channel EM circuit block comprises a function generator, a broadband amplifier, and a broadband impedance matching network. Although, in the embodiments in this disclosure, each dual-channel EM circuit block uses two function generators (one per channel), it is understood that, in some other embodiment, one dual-channel function generator may be used in place of two function generators.

FIG. 3 illustrates plasma system 300 comprising the plasma apparatus 110 and the dual-channel EM circuit block 350 comprising the first EM circuit block 120 to supply higher frequency EM source power and the second EM circuit block 320 to supply lower-frequency EM bias power. It is noted that the first EM circuit block 120 is identical to the higher frequency EM circuit block 120, which is described above with reference to FIGS. 1A and 2.

As explained above with reference to FIG. 1A, the higher frequency first EM circuit block 120 comprises the function generator 122, the high frequency broadband amplifier 124, and the high frequency broadband impedance matching network 126. The second EM circuit block 320 also comprises a function generator 322, similar to the function generator 122 but, being a lower frequency system, the second EM circuit block 320 has a low frequency broadband amplifier 324 and a low frequency broadband impedance matching network 326. The function generator 122 outputs a higher frequency broadband RF waveform that may be amplified by the high frequency broadband amplifier 124, whereas the function generator 322 is configured to output a lower frequency broadband RF waveform that may be amplified by the low frequency broadband amplifier 324.

As illustrated in FIG. 3, the upper electrode 118 and the pedestal 108 are receiving power to excite plasma in the plasma chamber 102. Note that the pedestal 108 is configured to function as an RF electrode, in addition to supporting the substrate. As explained above, in order to function as an RF electrode, the pedestal 108 is configured to include a disk-shaped conductive part, which is typically at the top of the pedestal in contact with the substrate 112. The pedestal 108 in plasma system 300 is similar to the pedestal 108 in plasma system 200, described above with reference to FIG. 2. In this example embodiment (plasma system 300), the upper electrode 118 is being used to couple EM source power to the plasma, while the pedestal 108 is being used to couple EM bias power to the plasma. Accordingly, the higher frequency first EM circuit block 120 is shown supplying power at the terminal of the upper electrode 118. In contrast, EM bias power is supplied at the pedestal 108 by the lower frequency second EM circuit block 320.

The plasma system 300 comprises a first V-I sensor 128 and a first V-I analyzing circuit 130 to sense the RF voltage and RF current waveforms being coupled to the upper electrode 118 (similar to the plasma system 100, illustrated in FIG. 1A). In addition, there is a second V-I sensor 328 and a second V-I analyzing circuit 330 to sense the RF voltage and RF current waveforms being coupled to the pedestal 108 (similar to the plasma system 200, illustrated in FIG. 2). Electrical characteristics extracted from the various waveforms by the V-I analyzing circuits 130 and 330 are transmitted to the controller 140 for storage and feedback control. The controller 140 is used to synchronously adjust the input parameters of the first EM circuit block 120, the second EM circuit block 320 and the DC bias generating circuits 132 and 332.

FIG. 4 illustrates plasma system 400 comprising the plasma apparatus 110 and an EM circuit block 450. Similar to the dual-channel EM circuit block 350, the dual-channel EM circuit block 450 also comprises the higher frequency first EM circuit block 120 to supply EM source power and the low-frequency second EM circuit block 320 to supply EM bias power. However, unlike in EM circuit block 350, in the EM circuit block 450, the EM source power and the EM bias power are superposed by using, for example, the same RF-pipe for both the EM source power and the EM bias power. A superposition of the two waveforms is coupled to the plasma apparatus 110 at the terminal of the pedestal 108. The superposed EM power is used by the pedestal 108 to couple power to the plasma excited in the chamber 102.

In the example plasma system 400, the upper electrode 118 is not being used to couple EM power to plasma in the plasma chamber 102, illustrated in FIG. 4. As explained above with reference to FIG. 2, in some embodiments, there may not be an upper electrode present if an upper electrode is not needed. However, if, as illustrated in FIG. 4, the upper electrode 118 is present but is not used then it may be floating (open circuit) or grounded (i.e., coupled to the reference potential), or coupled to the chamber wall, which may be coupled to ground, similar to the plasma system 200 (see FIG. 2). In addition, since the upper electrode 118 is not coupled to any power source, the plasma system 400 uses only one V-I sensor 128 and V-I analyzing circuit 130 to sense and analyze the RF voltage and RF current waveforms supplied to the pedestal 108. Likewise, the plasma system 400 may include only one DC bias generating circuit 132, coupled to the pedestal 108.

Figure 5:
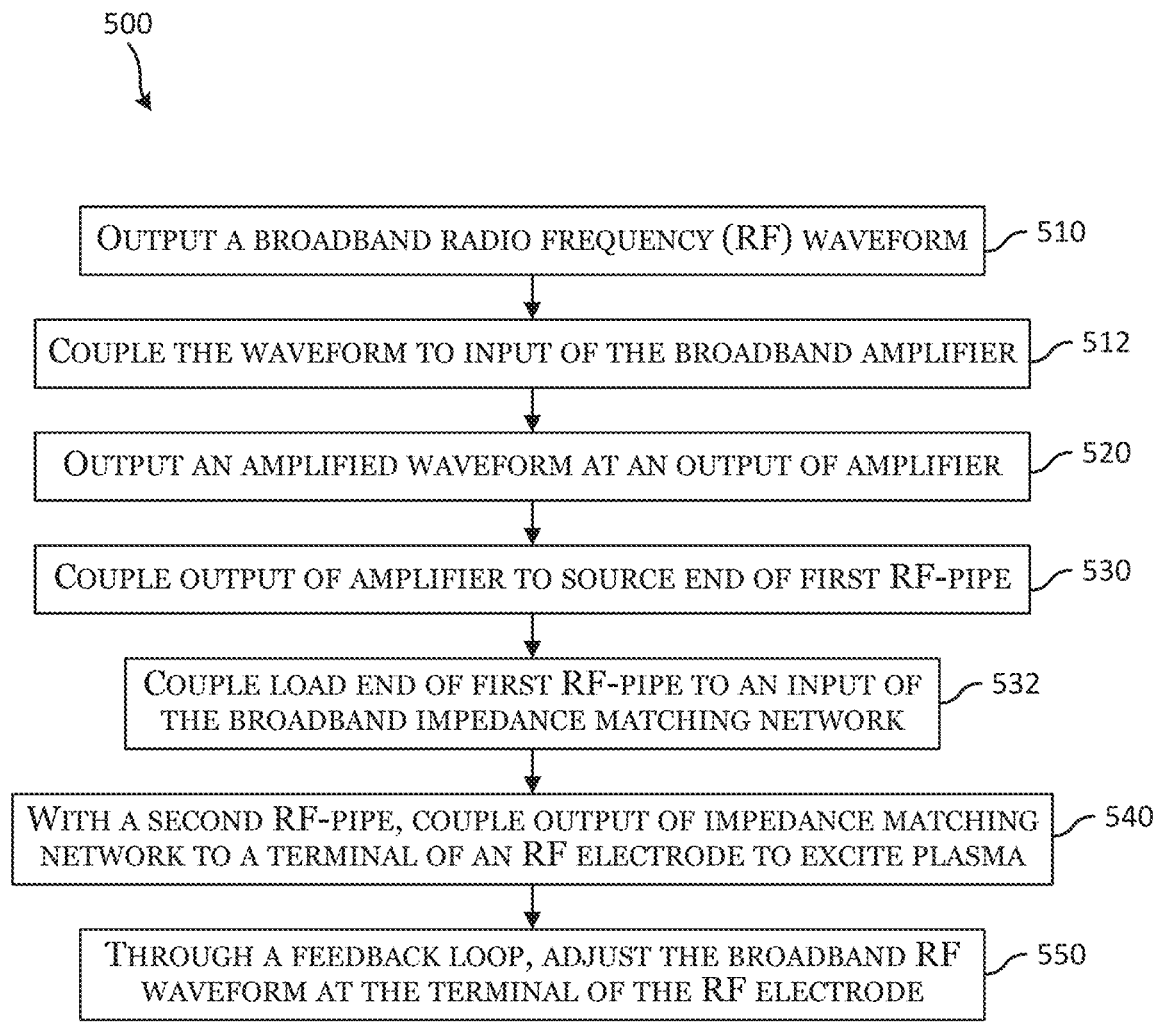
FIG. 5 illustrates a flowchart of a method for processing a substrate, in accordance with some embodiment.

A method 500 for processing a substrate, for example, substrate 112 in FIGS. 1A-4, is summarized in the flowchart illustrated in FIG. 5. In the method 500, described below with reference to the flowchart in FIG. 5, the substrate is processed using plasma excited in a plasma apparatus using EM power carried in broadband RF waveforms and coupled to plasma by electrodes of the plasma apparatus. At a terminal of each electrode, an EM circuit block delivers EM power carried in a broadband RF waveform.

As indicated in block 510, a broadband RF waveform is generated using, for example, a function generator configured to generate various arbitrary waveforms, such as the function generator 122, described above with reference to FIG. 1A. The broadband RF waveform output by the function generator is coupled to an input port of a broadband, linear power amplifier, as indicated in block 512 in FIG. 5.

In block 520, the broadband RF waveform is amplified by the broadband, linear power amplifier, such as the broadband amplifier 124, described above with reference to FIG. 1A. The broadband amplifier outputs an amplified waveform. Being a linear, power amplifier, the output of the broadband amplifier has high power compared to the output of the function generator, and the waveshape is maintained with high fidelity (i.e., low distortion).

The amplified waveform at the output of the broadband amplifier is coupled to a source end of a first RF-pipe, as indicated in block 530. The first RF-pipe is a coaxial RF-pipe, which may be modeled as a lossless transmission line, as described above. As indicated in block 532, a load end of the first RF-pipe is coupled to an input of a broadband impedance matching network. The load end of the RF pipe is opposite the source end of the first RF-pipe.

The broadband impedance matching network, such as the broadband impedance matching network 126, described above, includes switches, variable inductors and variable capacitors. These components are connected in a network, referred to as a reactive circuit, an example of which has been described above. The impedance of the respective matching network depends on a selection of the variable inductances, variable capacitances, and the states of the switches. In addition, the impedance is a frequency-dependent impedance. A controller may be programmed to set the input parameters for selecting the impedance of the respective broadband matching network to achieve efficient power transfer from the EM circuit block to the plasma apparatus over the frequency range of the spectrum of the broadband RF waveform.

Block 540 in the flowchart illustrated in FIG. 5 indicates that a second RF-pipe may be used to couple the waveform at the output of the impedance matching network to the terminal of the RF electrode. The waveform at the terminal of the RF electrode (matched for efficient power transfer to the plasma apparatus) excites plasma in a plasma chamber of the plasma apparatus.

Block 550 indicates that the broadband RF waveform at the terminal of the RF electrode may be adjusted through a feedback loop, as described with reference to FIGS. 1A-1B.

As mentioned above, the adjustments are made using control signals from the controller that set various input parameters of the EM circuit block. The feedback signal may be based on the RF voltage and RF current waveforms supplied to the terminal of the electrode. The RF waveforms may be measured using, for example, a V-I sensor. The V-I sensor may be configured to measure the RF waveforms by sensing the E-field and the H-field in the short second RF-pipe between the output of the impedance matching network and the terminal of the RF electrode of the plasma apparatus, as described above with reference FIGS. 1A and 1B. The measured RF waveforms may be analyzed to generate a feedback signal. As described above, with reference to FIG. 1A, the analysis may be performed in a V-I analyzing circuit that receives the measured RF waveforms from the V-I sensor. The feedback signal may be coupled from the V-I analyzing circuit to the controller using, for example, a coaxial cable. As described above, the controller may be used to adjust the waveform, as indicated in block 550 in the flowchart. The adjustments may be achieved by sending control signals from the controller to the various components of the EM circuit blocks used to generate the broadband RF waveforms.

Example 1. A plasma system includes a plasma apparatus including: a plasma chamber; a pedestal configured to hold a substrate in the chamber; and a radio frequency (RF) electrode configured to excite plasma in the chamber; an electromagnetic (EM) circuit block coupled to the RF electrode, the EM circuit block including: a function generator configured to output a broadband RF waveform, the waveform having EM power distributed over a range of frequencies; a broadband amplifier coupled to an output of the function generator, an operating frequency range of the amplifier including the range of frequencies; and a broadband impedance matching network having an input coupled to an output of the broadband amplifier and an output coupled to a terminal of the RF electrode, an operating frequency range of the broadband impedance matching network including the range of frequencies; and a controller configured to adjust an input parameter of the EM circuit block.

Example 2. The plasma system of example 1, where the broadband impedance matching network includes a variable inductor.

Example 3. The plasma system of one of examples 1 or 2, where the broadband impedance matching network includes a variable capacitor.

Example 4. The plasma system of one of examples 1 to 3, further including a first RF-pipe having a source end coupled to the output of the broadband amplifier and a load end coupled to the input of the broadband impedance matching network, the load end being opposite the source end, where, during operation, a magnitude of a reflection coefficient is less than or equal to 0.6, the reflection coefficient being a ratio of an amplitude of a reflected EM wave to an amplitude of a transmitted EM wave, where an EM wave in the first RF-pipe is a superposition of the transmitted EM wave traveling from the source end to the load end and the reflected EM wave traveling in the opposite direction.

Example 5. The plasma system of one of examples 1 to 4, where the operating frequency range of the broadband amplifier and the operating frequency range of the impedance matching network includes the range of frequencies greater than or equal to 10 MHz and less than or equal to 300 MHz.

Example 6. The plasma system of one of examples 1 to 5, further including a DC bias generating circuit having an output coupled to the RF electrode, the DC bias generating circuit being configured to output a constant DC bias or a pulsed DC bias waveform.

Example 7. The plasma system of one of examples 1 to 6, where the RF electrode is a disk-shaped electrode disposed in an upper portion of the chamber.

Example 8. The plasma system of one of examples 1 to 7, where the RF electrode is a disk-shaped conductive portion of the pedestal.

Example 9. The plasma system of one of examples 1 to 8, where the RF electrode is an antenna disposed outside the plasma chamber.

Example 10. The plasma system of one of examples 1 to 9, further including: a voltage and current (V-I) sensor including a voltage pickup and a current pickup placed at a location along a second RF-pipe coupling the broadband impedance matching network to the RF electrode, where the V-I sensor is configured to measure an RF voltage waveform and an RF current waveform in the second RF-pipe at the location; and a V-I analyzing circuit configured to receive the RF voltage waveform and the RF current waveform, where the V-I analyzing circuit includes electronic circuitry configured to extract electrical characteristics from the received RF voltage waveform and RF current waveform and output an electronic feedback signal encoding the electrical characteristics.

Example 11. The plasma system of one of examples 1 to 10, where a length of the second RF-pipe is less than one-eighth of a representative wavelength of the RF voltage waveform and the RF current waveform.

Example 12. The plasma system of one of examples 1 to 11, where the controller includes: an input port configured to receive the electronic feedback signal; an electronic memory; a processor; data and instructions stored in the memory, where the data includes a process recipe and the electrical characteristics, and where the instructions, when executed by the processor, generates a control signal; and an output port configured to transmit the control signal to an input port of the EM circuit block.

Example 13. A plasma system includes a plasma apparatus; a dual-channel electromagnetic (EM) circuit block including: a first EM circuit block including a first function generator, a first broadband amplifier, and a first broadband impedance matching network, where the first EM circuit block outputs a first broadband RF waveform coupled to the plasma apparatus, the first broadband RF waveform having EM power distributed over a first range of frequencies; and a second EM circuit block including a second function generator, a second broadband amplifier, and a second broadband impedance matching network, where the second EM circuit block outputs a second broadband RF waveform coupled to the plasma apparatus, the second broadband RF waveform having EM power distributed over a second range of frequencies, the second range being different from the first range; and a controller configured to adjust a plurality of input parameters of the EM circuit block.

Example 14. The plasma system of example 13, where the first range of frequencies includes the range of frequencies greater than or equal to 10 MHz and less than or equal to 300 MHz and, where the second range of frequencies includes the range of frequencies greater than or equal to 100 kHz and less than or equal to 13 MHz.

Example 15. The plasma system of one of examples 13 or 14, where the plasma apparatus includes a plasma chamber, an upper RF electrode, and a lower RF electrode, the lower RF electrode being a pedestal configured to support a substrate in the plasma chamber.

Example 16. The plasma system of one of examples 13 to 15, where the first broadband RF waveform and the second RF broadband waveform are coupled to different RF electrodes of the plasma apparatus.

Example 17. The plasma system of one of examples 13 to 16, where the first broadband RF waveform and the second RF broadband waveform are coupled to the same RF electrode of the plasma apparatus.

Example 18. A method of operating a plasma processing system, the method including: at an output of a function generator, outputting a broadband radio frequency (RF) waveform; coupling the output of the function generator to an input of a broadband amplifier; at an output of the broadband amplifier, outputting an amplified broadband RF waveform; coupling the output of the broadband amplifier to a source end of a first RF-pipe; coupling a load end of the first RF-pipe to an input of a broadband impedance matching network, the load end being opposite the source end; and using a second RF-pipe, coupling an output of the broadband impedance matching network to a terminal of an RF electrode of a plasma apparatus, the coupling providing EM power at the RF electrode that excites plasma in a plasma chamber of the plasma apparatus.

Example 19. The method of example 18, further including adjusting, through a feedback loop, a broadband RF waveform at the terminal of the RF electrode of the plasma apparatus.

Example 20. The method of one of examples 18 or 19 further including: measuring a RF voltage waveform and a RF current waveform with a voltage pickup and a current pickup of a voltage and current (V-I) sensor at a location along the second RF-pipe; transmitting the RF voltage waveform and the RF current waveform to a V-I analyzing circuit, the V-I analyzing circuit including electronic circuitry configured to perform an analysis of the received waveforms; performing the analysis with the electronic circuitry to extract electrical characteristics from the received waveforms; outputting an electronic feedback signal encoding the electrical characteristics; and coupling the electronic feedback signal to an input port of a controller.

Example 21. The method of one of examples 18 to 20, further including: in a memory device of the controller, storing the electrical characteristics encoded in the feedback signal; generating a number of control signals based on processing of the electrical characteristics with instructions executed by a processor of the controller; transmitting each control signal to a respective input port of the function generator, the broadband amplifier, and the broadband impedance matching network; and based on the control signals, synchronously adjusting input parameters of the function generator, the broadband amplifier, and the broadband impedance matching network, the adjustments adjusting a broadband RF waveform at the terminal of the RF electrode of the plasma apparatus.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A plasma system comprising:
a plasma apparatus comprising a plasma chamber and a substrate support disposed in the plasma chamber;
an electromagnetic (EM) circuit block coupled to a radio frequency (RF) electrode, the EM circuit block comprising:
a broadband RF waveform function generator, the broadband RF waveform having EM power distributed over a range of frequencies, and
a broadband impedance matching network having an input coupled to an output of the broadband RF waveform function generator and an output coupled to a terminal of the RF electrode, an operating frequency range of the broadband impedance matching network including the range of frequencies; and
a controller programmed to adjust an input parameter of the EM circuit block.

2. The plasma system of claim 1, wherein the broadband impedance matching network comprises a variable inductor.

3. The plasma system of claim 1, wherein the broadband impedance matching network comprises a variable capacitor.

4. The plasma system of claim 1, further comprising:
a broadband amplifier; and
a first RF-pipe having a source end coupled to the output of the broadband amplifier and a load end coupled to the input of the broadband impedance matching network, the load end being opposite the source end.

5. The plasma system of claim 4, wherein, during operation, a magnitude of a reflection coefficient is less than or equal to 0.6, the reflection coefficient being a ratio of an amplitude of a reflected EM wave to an amplitude of a transmitted EM wave, wherein an EM wave in the first RF-pipe is a superposition of the transmitted EM wave traveling from the source end to the load end and the reflected EM wave traveling in the opposite direction.

6. The plasma system of claim 1, further comprising a DC bias generating circuit having an output coupled to the RF electrode.

7. The plasma system of claim 1, wherein the RF electrode is a disk-shaped electrode disposed in an upper portion of the chamber.

8. The plasma system of claim 1, wherein the RF electrode is a disk-shaped conductive portion of the substrate support.

9. The plasma system of claim 1, wherein the RF electrode is an antenna disposed outside the plasma chamber.

10. The plasma system of claim 1, further comprising:
a voltage and current (V-I) sensor comprising a voltage pickup and a current pickup placed at a location along a second RF-pipe coupling the broadband impedance matching network to the RF electrode; and
a V-I analyzing circuit configured to extract electrical characteristics from an RF voltage waveform from the voltage pickup and a RF current waveform from the current pickup and output an electronic feedback signal encoding the electrical characteristics.

11. The plasma system of claim 10, wherein a length of the second RF-pipe is less than one-eighth of a representative wavelength of the RF voltage waveform and the RF current waveform.

12. The plasma system of claim 10, wherein the controller comprises:
an input port configured to receive the electronic feedback signal;
an electronic memory;
a processor;
data and instructions stored in the memory,
wherein the data comprises a process recipe and the electrical characteristics, and
wherein the instructions, when executed by the processor, generate a control signal; and
an output port configured to transmit the control signal to an input port of the EM circuit block.

13. A plasma system comprising:
a plasma apparatus;
a dual-channel electromagnetic (EM) circuit block comprising:
a first EM circuit block comprising a first function generator and a first broadband impedance matching network, wherein the first EM circuit block outputs a first broadband RF waveform coupled to the plasma apparatus, the first broadband RF waveform having EM power distributed over a first range of frequencies; and
a second EM circuit block comprising a second function generator and a second broadband impedance matching network, wherein the second EM circuit block outputs a second broadband RF waveform coupled to the plasma apparatus, the second broadband RF waveform having EM power distributed over a second range of frequencies, the second range being different from the first range.

14. The plasma system of claim 13, further comprising:
a controller programmed to adjust a first input parameter of the first EM circuit block and a second input parameter of the second EM circuit block.

15. The plasma system of claim 13, wherein the first range of frequencies includes the range of frequencies greater than or equal to 10 MHz and less than or equal to 300 MHz, and wherein the second range of frequencies includes the range of frequencies greater than or equal to 100 kHz and less than or equal to 13 MHz.

16. The plasma system of claim 13, wherein the plasma apparatus comprises a plasma chamber, an upper RF electrode, and a lower RF electrode, the lower RF electrode being a substrate support.

17. The plasma system of claim 16, wherein the first broadband RF waveform and the second RF broadband waveform are coupled to different RF electrodes of the plasma apparatus.

18. The plasma system of claim 16, wherein the first broadband RF waveform and the second RF broadband waveform are coupled to the same RF electrode of the plasma apparatus.

19. A method of operating a plasma processing system, the method comprising:
generating a broadband RF waveform at a function generator;
transmitting the broadband RF waveform through a first radio frequency (RF) pipe to a broadband impedance matching network; and
coupling an output of the broadband impedance matching network to a terminal of an RF electrode of a plasma apparatus through a second RF pipe to power a plasma in a plasma chamber of the plasma apparatus.

20. The method of claim 19, further comprising adjusting, through a feedback loop, a broadband RF waveform at the terminal of the RF electrode of the plasma apparatus.

21. The method of claim 19, further comprising:
measuring an RF voltage waveform and an RF current waveform with a voltage pickup and a current pickup of a voltage and current (V-I) sensor at a location along the second RF pipe;
transmitting the RF voltage waveform and the RF current waveform to a V-I analyzing circuit; and
extracting electrical characteristics from the RF voltage and current waveforms.

22. The method of claim 21, further comprising:
generating control signals based on processing of the electrical characteristics;
transmitting one of the control signals to a respective input port of the function generator and the broadband impedance matching network; and
based on the control signals, synchronously adjusting input parameters of the function generator and the broadband impedance matching network, the adjustments adjusting a broadband RF waveform at the terminal of the RF electrode of the plasma.

* * * * *